(12) United States Patent
Kamijima

(10) Patent No.: US 7,655,282 B2
(45) Date of Patent: Feb. 2, 2010

(54) METHOD OF FORMING PATTERNED FILM

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 411 days.

(21) Appl. No.: 11/699,549

(22) Filed: Jan. 30, 2007

(65) Prior Publication Data

US 2007/0122553 A1    May 31, 2007

Related U.S. Application Data

(62) Division of application No. 10/617,169, filed on Jul. 11, 2003, now abandoned.

(30) Foreign Application Priority Data

Jul. 31, 2002  (JP) ............................ 2002-222799

(51) Int. Cl.
*C23C 14/16* (2006.01)
(52) U.S. Cl. ...................... 427/527; 427/531; 427/97.9; 427/99.5; 427/102
(58) Field of Classification Search ................. 427/527, 427/531, 97.9, 99.5, 102
See application file for complete search history.

(56) References Cited

U.S. PATENT DOCUMENTS

| | | | |
|---|---|---|---|
| 3,093,502 A | 6/1963 | Drelich | |
| 3,853,715 A | 12/1974 | Romankiw | |
| 5,043,043 A | 8/1991 | Howe et al. | |
| 5,622,761 A | 4/1997 | Cole | |
| 5,721,078 A | 2/1998 | Kamijima | |
| 5,725,997 A | 3/1998 | Kamijima | |
| 5,747,198 A | 5/1998 | Kamijima | |
| 5,773,200 A | 6/1998 | Okazaki et al. | |
| 5,989,667 A | 11/1999 | Tayebi | |
| 6,165,587 A | 12/2000 | Nonaka | |
| 6,201,243 B1 | 3/2001 | Jerominek | |
| 6,289,578 B1 | 9/2001 | Kamijima | |
| 6,452,743 B1 | 9/2002 | Sasaki | |
| 6,459,542 B1 | 10/2002 | Sato | |
| 6,655,207 B1 | 12/2003 | Speldrich et al. | |
| 6,683,387 B1 * | 1/2004 | Brownfield | ................ 257/786 |
| 6,764,936 B2 | 7/2004 | Daneman et al. | |
| 2001/0055831 A1 | 12/2001 | Daneman et al. | |

FOREIGN PATENT DOCUMENTS

| | | |
|---|---|---|
| JP | B2-56-36706 | 8/1981 |
| JP | A-02-064909 | 3/1990 |
| JP | 02-281623 | 11/1990 |
| JP | A-08-069111 | 3/1996 |
| JP | A-09-096909 | 4/1997 |
| JP | A-09-252087 | 9/1997 |
| JP | A-10-116402 | 5/1998 |

* cited by examiner

*Primary Examiner*—Binh X Tran
(74) *Attorney, Agent, or Firm*—Oliff & Berridge, PLC

(57) ABSTRACT

A method of forming a patterned thin film comprises the step of forming a frame having an undercut near the bottom thereof on an electrode film, and the plating step of forming the patterned thin film by plating through the use of the frame. The patterned thin film includes a plurality of linear portions disposed side by side. Each of the linear portions has a portion close to the electrode film. This portion has a width greater than the width of the remaining portion of each of the linear portions.

1 Claim, 10 Drawing Sheets

METHOD OF FORMING PATTERNED FILM

This is a Division of application Ser. No. 10/617,169 filed Jul. 11, 2003 now abandoned. The disclosure of the prior application is hereby incorporated by reference herein in its entirety.

BACKGROUND OF THE INVENTION

1. Field of the Invention

The present invention relates to a patterned thin film including a linear portion and a method of forming the same.

2. Description of the Related Art

Frame plating is one of the methods of forming a thin film that is patterned (referred to as patterned thin film in the present patent application), such as the method disclosed in Published Examined Japanese Patent Application Showa 56-36706 (1981). To perform the frame plating disclosed, an electrode film is formed on a substrate, for example, and a resist layer is formed on the electrode film. The resist layer is patterned by photolithography to form a frame to be used for plating. Electroplating is then performed through the use of the frame with the electrode film already formed as an electrode and a seed layer, so as to form a patterned thin film made of a conductive material.

A patterned thin film formed by frame plating may be utilized in microdevices, for example. Such microdevices include a thin-film inductor, a thin-film magnetic head, a semiconductor device, a sensor incorporating thin films, and an actuator incorporating thin films.

Patterned thin films include those having a plurality of linear portions disposed side by side, such as a coil or wiring. For such a patterned thin film it is required to reduce the width of the linear portions and to reduce the space between adjacent linear portions in some cases so as to enhance the integration.

If the width of the linear portions of the patterned thin film is made too small, however, the resistance of the linear portions increases and a problem such as generation of heat in the linear portions arises.

The following problem arises if the space between adjacent ones of the linear portions of the patterned thin film is reduced. When the patterned thin film is formed by frame plating, the space between adjacent ones of the linear portions is determined by the width of a dividing portion disposed between adjacent ones of grooves of the frame. The minimum width of the dividing portion depends on the resolution of the resist used for making the frame. The resolution of the resist is determined by the material of the resist and the exposure method. As thus described, to form the patterned thin film by frame plating, it is difficult to make the space between adjacent ones of the linear portions of the patterned thin film smaller than the limit determined by the resolution of the resist.

OBJECTS AND SUMMARY OF THE INVENTION

It is a first object of the invention to provide a method of forming a patterned thin film by frame plating to form the patterned thin film including a linear portion that is small in width and has a low resistance.

It is a second object of the invention to provide a patterned thin film including a linear portion that is small in width and has a low resistance.

A method of the invention is provided for forming a patterned thin film including a linear portion by frame plating. The method comprises: the step of forming a frame having an undercut near the bottom thereof on a base layer; and the plating step of forming the patterned thin film by plating through the use of the frame such that the linear portion has a portion close to the base layer, the portion having a width greater than a width of the remaining portion of the linear portion.

According to the method of forming the patterned thin film of the invention, it is possible to reduce the width of the linear portion of the patterned thin film and to reduce the resistance of the linear portion.

According to the method of the invention, the patterned thin film may be formed to include a plurality of linear portions disposed side by side.

A patterned thin film of the invention is disposed on a base layer and includes a linear portion. The linear portion has a portion close to the base layer. This portion has a width greater than a width of the remaining portion of the linear portion.

According to the patterned thin film of the invention, it is possible to reduce the width of the linear portion and to reduce the resistance of the linear portion.

The patterned thin film of the invention may include a plurality of linear portions disposed side by side.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

First Embodiment

Figure 1:
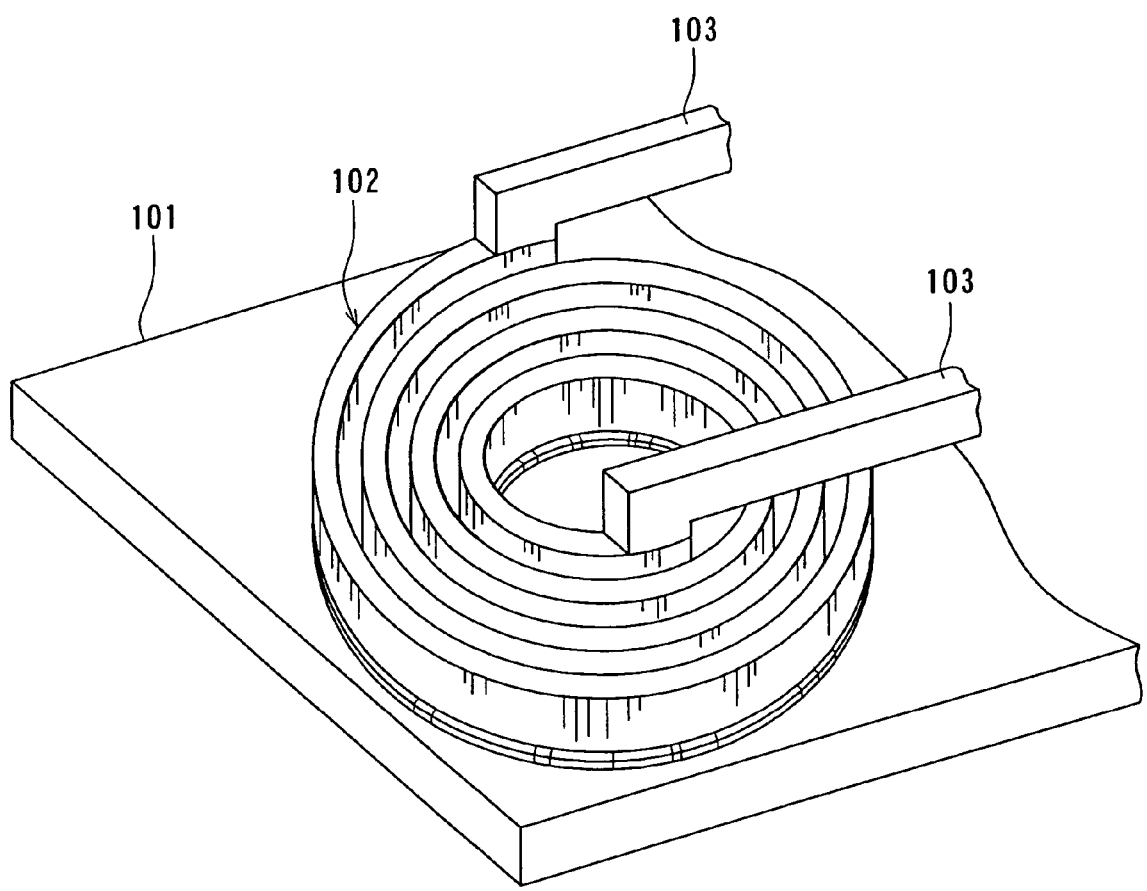
FIG. 1 is a perspective view of a thin-film inductor as an example of a microdevice to which a method of forming a patterned thin film of a first embodiment of the invention is applied.

Reference is now made to FIG. 1 to describe a thin-film inductor as an example of a microdevice to which a method of forming a patterned thin film of a first embodiment of the invention is applied. FIG. 1 is a perspective view of the thin-film inductor of the embodiment.

The thin-film inductor of FIG. 1 comprises: a substrate 101; a thin-film coil 102 formed on the substrate 101; and two leads 103 connected to ends of the thin-film coil 102, respectively. The thin-film coil 102 is formed by frame plating. The thin-film coil 102 corresponds to the patterned thin film of the first embodiment.

Reference is now made to FIG. 2 to FIG. 9 to give a detailed description of the patterned thin film and the method of forming the same of the embodiment. In the embodiment a frame having an undercut near the bottom thereof is utilized to form the patterned thin film by frame plating. A 'two-layer resist' is utilized to form the above-mentioned frame in the embodiment. The two-layer resist is a two-layer film having a first layer that is a lower layer and a second layer that is an upper layer, wherein at least the second layer is made of a resist. The two-layer resist is disclosed in, for example, the U.S. Pat. No. 5,721,078, the U.S. Pat. No. 5,725,997, and the U.S. Pat. No. 5,747,198.

Figure 2:
FIG. 2 is a cross section for illustrating a step in the method of forming the patterned thin film of the first embodiment of the invention.

According to the method of forming the patterned thin film of the embodiment, as shown in FIG. 2, an electrode film 2 is formed by sputtering, for example, on a substrate 1. The substrate 1 may be made of a semiconductor such as silicon (Si), or a ceramic such as aluminum oxide and titanium carbide (Al2O3-TiC), or a resin such as polyethylene terephthalate. The electrode film 2 is made of a conductive material such as a metal. The electrode film 2 is preferably made of a material having a composition the same as that of a material of which the patterned thin film to be formed on the electrode film 2 is made. The electrode film 2 may be made up of a single layer or a plurality of layers, and made of copper (Cu), for example.

Figure 3:
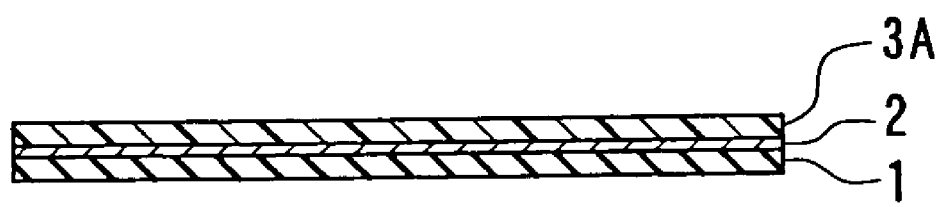
FIG. 3 is a cross section for illustrating a step that follows FIG. 2.

FIG. 3 illustrates the following step. In the step a material that will be dissolved in a developer is applied by spin-coating, for example, to the electrode film 2 to be the base of the patterned thin film. A first layer 3A to be used for making the frame is thereby formed. The first layer 3A may be made of polymethylglutarimide, for example. Next, heat processing is performed on the first layer 3A as required.

Figure 4:
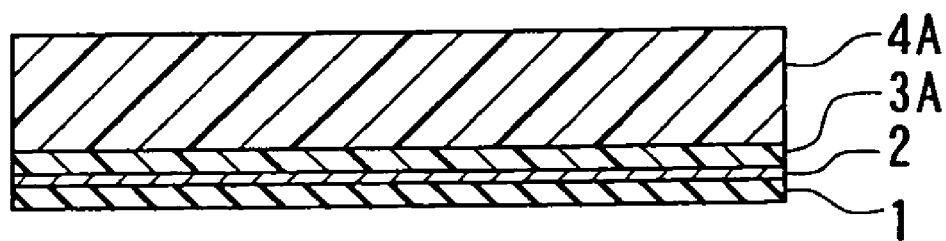
FIG. 4 is a cross section for illustrating a step that follows FIG. 3.

Next, a resist is applied to the first layer 3A by a method such as spin-coating, to form a second layer 4A to be used for making the frame, as shown in FIG. 4. Next, heat processing is performed on the second layer 4A as required. The two-layer resist is made up of the first layer 3A and the second layer 4A.

Figure 5:
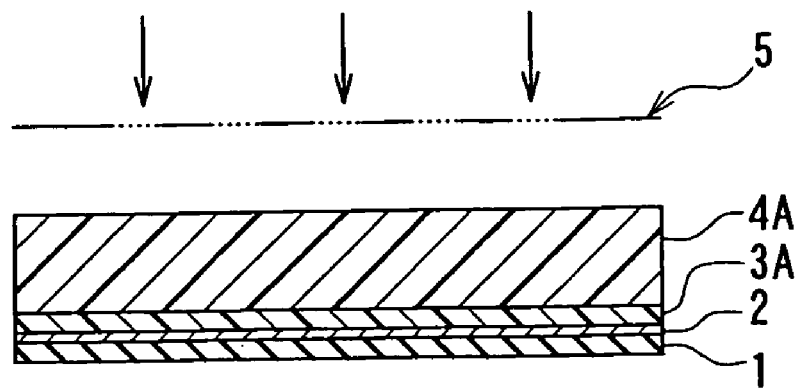
FIG. 5 is a cross section for illustrating a step that follows FIG. 4.

Next, as shown in FIG. 5, the second layer 4A is exposed through a mask 5 to form a latent image corresponding to the pattern of the mask 5 on the second layer 4A. Next, heat processing is performed on the second layer 4A as required.

Figure 6:
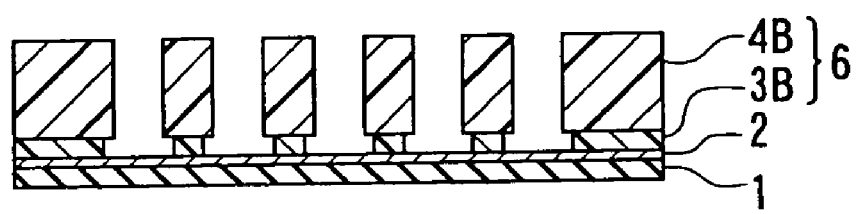
FIG. 6 is a cross section for illustrating a step that follows FIG. 5.

FIG. 6 illustrates the following step. In the step the second layer 4A is developed with a developer. At the same time portions of the second layer 4A and portions of the first layer 3A are dissolved in the developer. A patterned first frame layer 3B is thereby made up of the remaining first layer 3A, and a patterned second frame layer 4B is thereby made up of the remaining second layer 4A. The first frame layer 3B has a width smaller than the width of the second frame layer 4B. FIG. 6 shows an example in which the resist used for making the second layer 4A is positive, and the portions of the second layer 4A exposed are thus removed after development. Next, the first frame layer 3B and the second frame layer 4B are cleaned with water and dried.

In such a manner the first layer 3A and the second layer 4A are patterned and the frame 6 that is made up of the first frame layer 3B and the second frame layer 4B and has the undercut near the bottom thereof is formed.

Figure 7:
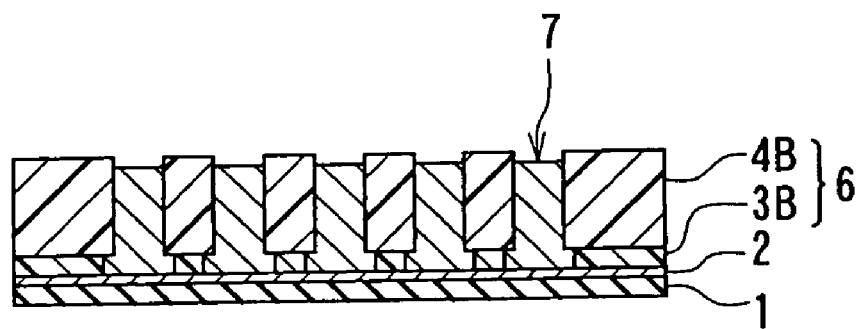
FIG. 7 is a cross section for illustrating a step that follows FIG. 6.

Next, pre-plating processing is performed as required, which is followed by feeding a current to the electrode film 2 to perform electroplating through the use of the frame 6. A patterned thin film 7 is thereby formed in the groove of the frame 6, as shown in FIG. 7. The patterned thin film 7 is made of a conductive material such as a metal, and may be made of copper (Cu).

Figure 8:
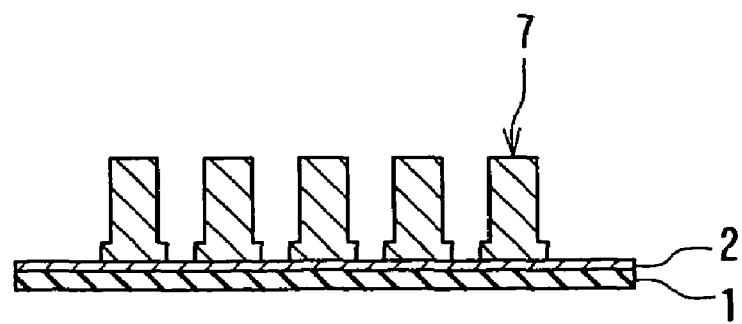
FIG. 8 is a cross section for illustrating a step that follows FIG. 7.

Next, the layered structure of FIG. 7 is soaked in an organic solvent and shaken, for example, so as to dissolve and remove the first frame layer 3B and the second frame layer 4B, as shown in FIG. 8.

Figure 9:
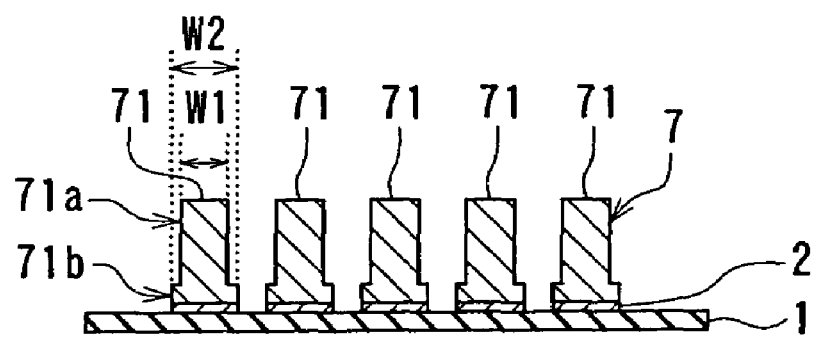
FIG. 9 is a cross section for illustrating a step that follows FIG. 8.

Finally, as shown in FIG. 9, portions of the electrode film 2 except the portion below the patterned thin film 7 are removed by wet etching, or dry etching such as ion milling or reactive ion etching, using the patterned thin film 7 as a mask.

The patterned thin film 7 thus formed includes a plurality of linear portions 71 disposed side by side. In the patterned thin film 7 each of the linear portions 71 has a portion (hereinafter called a second portion) 71b close to the electrode film 2 that is the base layer of the patterned thin film 7. The second portion 71b has a width W2 that is greater than a width W1 of the remaining portion (hereinafter called a first portion) 71a of each of the linear portions 71.

Figure 10:
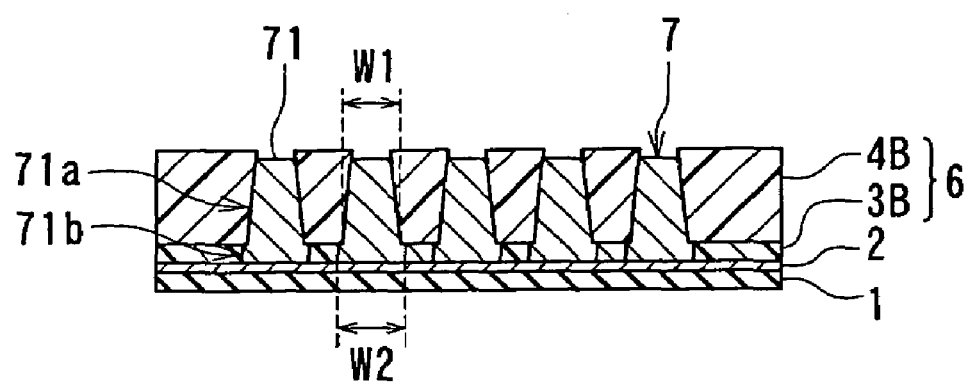
FIG. 10 is a cross section of another configuration of the patterned thin film of the first embodiment.
Figure 11:
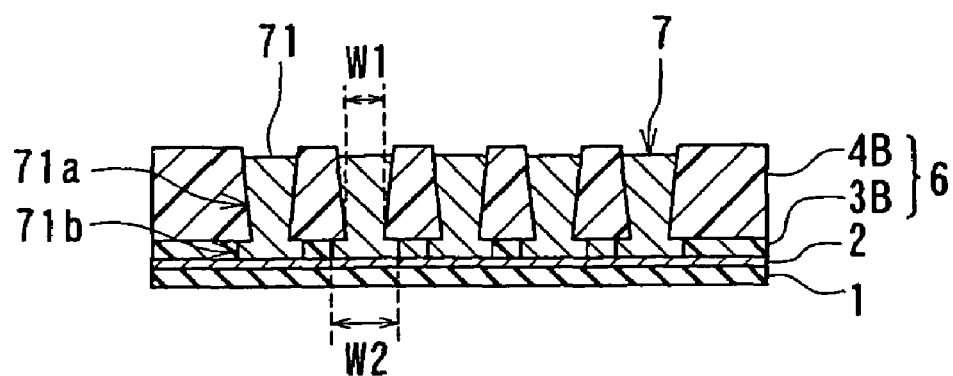
FIG. 11 is a cross section of still another configuration of the patterned thin film of the first embodiment.
Figure 12:
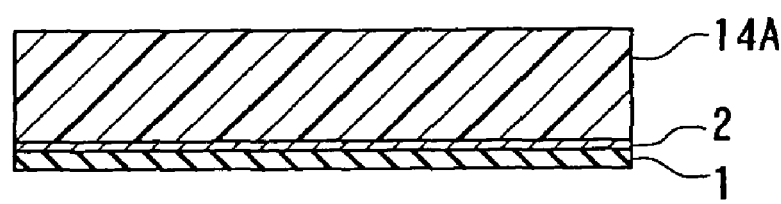
FIG. 12 is a cross section for illustrating a step in a method of forming a patterned thin film of a second embodiment of the invention.

FIG. 6 to FIG. 9 show an example in which the walls of the second frame 4B are orthogonal to the top surface of the substrate 1 and the sidewalls of the first portion 71a of each of the linear portions 71 are thereby orthogonal to the top surface of the substrate 1. However, the embodiment includes examples illustrated in FIG. 10 and FIG. 11. FIG. 10 and FIG. 11 both illustrate the state immediately after the patterned thin film 7 is formed by plating through the use of the frame 6. In both of the examples shown in FIG. 10 and FIG. 11 the walls of the second frame 4B and the sidewalls of the first portion 71a are at an angle with respect to the direction orthogonal to the top surface of the substrate 1. In the example shown in FIG. 10 the second frame 4B has two walls opposed to each other, the groove of the frame 6 being disposed in between. The space between the two walls decreases as the distance to the upper portions of the walls decreases. As a result, the width of the first portion 71a decreases as the distance to the upper portion thereof decreases in the example shown in FIG. 10. The width W2 of the second portion 71b is greater than the width W1 of the first portion 71a taken at the interface between the first portion 71a and the second portion 71b in the example shown in FIG. 10. In the example shown in FIG. 11 the second frame 4B has the two walls opposed to each other, the groove of the frame 6 being disposed in between. The space between the two walls increases as the distance to the upper portions of the walls decreases. As a result, the width of the first portion 71a increases as the distance to the upper portion thereof decreases in the example shown in FIG. 11. The width W2 of the second portion 71b is greater than the width W1 of the first portion 71a taken at the interface between the first portion 71a and the second portion 71b in the example shown in FIG. 11.

As thus described, the method of forming the patterned thin film of the embodiment comprises the step of forming the frame 6 having the undercut near the bottom thereof on the electrode film 2 that is the base layer, and the plating step of forming the patterned thin film 7 by plating through the use of the frame 6. The patterned thin film 7 includes a plurality of linear portions 71 disposed side by side. Each of the linear portions 71 has the first portion 71a and the second portion 71b closer to the electrode film 2. The width W2 of the second portion 71b is greater than the width W1 of the first portion 71a. As a result, according to the embodiment, it is possible to make the resistance of each of the linear portions 71 lower, compared to the case in which each of the linear portions 71 of the patterned thin film 7 has a uniform width W1 throughout.

According to the embodiment, it is difficult to make the space between adjacent ones of the first portions 71a smaller than the limit determined by the resolution of the resist used for the second layer 4A. However, it is possible to make the space between adjacent ones of the second portions 71b smaller than the limit determined by the resolution of the resist. Therefore, according to the embodiment, it is possible to make the width W2 of the second portion 71b greater than the width W1 of the first portion 71a without changing the pitch of the linear portions 71, and to thereby make the resistance of the linear portions 71 lower, compared to the case in which each of the linear portions 71 has a uniform width W1 throughout.

The foregoing features of the embodiment achieve formation of the patterned thin film 7 having the linear portions 71 that are small in width and have a low resistance, without changing the pitch of the linear portions 71. It is thereby possible to prevent the linear portions 71 from generating heat.

In the case in which each of the linear portions 71 has a uniform width throughout, if the space between adjacent ones of the linear portions 71 is reduced, it may be impossible to successfully remove the portion of the electrode film 2 located between adjacent ones of the linear portions 71 by etching. In contrast, according to the embodiment of the invention, the space between adjacent ones of the first portions 71a is greater than the space between adjacent ones of the second portions 71b. Therefore, even if the space between adjacent ones of the second portions 71b is small, it is possible to successfully remove the portion of the electrode film 2 located between adjacent ones of the linear portions 71 by etching.

An example of the method of forming the patterned thin film of the embodiment will now be described. In this example a silicon substrate having a diameter of 3 inches (76.2 mm) and a thickness of 0.4 mm was utilized as the substrate 1. According to the method of the example, Cu was sputtered on the substrate 1 under the conditions described below, using a sputter, to form the electrode film 2 made of Cu and having a thickness of 100 nm. The sputter was the DC sputter SPF-740H (the product name) manufactured by ANELVA Corporation. The target of the sputter was Cu. The output of the sputter was 1000 W. To the chamber of the sputter an Ar gas was supplied at a flow rate of 50 sccm. The pressure of the Ar gas in the chamber was 2.0 mTorr (approximately 0.266 Pa).

Next, polymethylglutarimide was applied to the electrode film 2 by spin-coating to form the first layer 3A. Polymethylglutarimide utilized was the LOL-1000 (the product name) manufactured by Shipley Company. The thickness of the first layer 3A was 100 nm. Next, heat processing was performed on the first layer 3A, using a hot plate, at a temperature of 180° C. for 600 seconds. The first layer 3A was then cooled to the room temperature.

Next, a resist was applied to the first layer 3A by spin-coating to form the second layer 4A. The resist utilized was the SIPR-9740 (the product name) manufactured by Shin-Etsu Chemical Co., Ltd. The thickness of the second layer 4A was 3 µm. Next, heat processing was performed on the second layer 4A, using the hot plate, at a temperature of 100° C. for 180 seconds.

Next, the second layer 4A was exposed through the mask 5, using an exposure apparatus, under the following conditions to form a latent image corresponding to the pattern of the mask 5 on the second layer 4A. The exposure apparatus utilized was the NSR-i12TFH (the product name) manufactured by Nikon Corporation. The mask 5 had a pattern in which a translucent section was 10-turn whorl-shaped, a shade section had a width of 1.0 µm, the translucent section had a width of 1.5 µm, and the pitch of the translucent section was 2.5 µm. The dose was 300 mJ/cm$^2$.

Next, an aqueous solution of 2.38% tetramethylammonium hydroxide was utilized as a developer to perform 50-second development on the second layer 4A twice by the puddle method. As a result, portions of the second layer 4A and portions of the first layer 3A were dissolved in the developer. The first frame layer 3B and the second frame layer 4B were thereby formed. The first frame layer 3B and the second frame layer 4B were then cleaned with water and dried. The frame 6 was thus completed.

Next, electroplating was performed, using the frame 6, to form the patterned thin film 7 of Cu in the groove of the frame 6. A cupric sulfate bath that is typically used for plating of Cu was employed as a plating bath. The patterned thin film 7 had a thickness of 2.8 µm.

Next, the layered structure including the patterned thin film 7 was soaked in acetone and shaken to dissolve and remove the frame 6.

Next, the electrode film 2 was selectively etched under the following conditions, using an ion-milling apparatus, to remove portions of the electrode film 2 except the portion below the patterned thin film 7. The ion-milling apparatus utilized was the 8C (the product name) manufactured by Commonwealth Scientific Corporation. The output of the apparatus was 500 W and 500 mA. The pressure in the etching chamber was 3 mTorr (approximately 0.399 Pa). The angle at which ions were applied was 0 degree (the direction of ion application orthogonal to the substrate).

As thus described, a 10-turn thin-film coil that was made up of the patterned thin film 7 and that had a pitch of 2.5 µm and a thickness of 2.8 µm was obtained. In each of the linear portions 71 of the patterned thin film 7 the width W1 of the first portion 71a was 1.7 µm and the width W2 of the second portion 71b was 2.1 µm. The second portion 71b had two portions extending more outward than the sidewalls of the first portion 71a. The cross section of each of these two portions was a rectangle having a width of 0.2 µm and a height of 0.1 µm.

Second Embodiment

Reference is now made to FIG. 12 to FIG. 20 to describe a method of forming a patterned thin film of a second embodiment of the invention. In the second embodiment a frame having an undercut near the bottom thereof is formed through the use of a microgroove. A method of forming a resist layer having an undercut near the bottom thereof is disclosed in the U.S. Pat. No. 5,773,200.

The method of the second embodiment includes the steps up to the step of forming the electrode film 2 illustrated in FIG. 2 that are the same as those of the first embodiment. In the following step of the second embodiment a resist is applied to the electrode film 2 by a method such as spin-coating to form a resist layer 14A. The resist utilized is positive and one that easily forms a microgroove, in particular. To be specific, the types of resists disclosed in the U.S. Pat. No. 5,773,200 may be utilized as such a resist. Next, heat processing is performed on the resist layer 14A as required.

Figure 13:
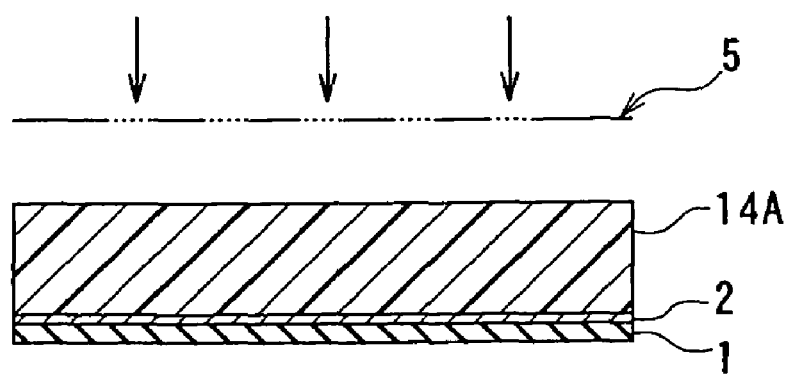
FIG. 13 is a cross section for illustrating a step that follows FIG. 12.

Next, as shown in FIG. 13, the resist layer 14A is exposed through the mask 5 to form a latent image corresponding to the pattern of the mask 5 on the resist layer 14A. Next, heat processing is performed on the resist layer 14A as required.

Figure 14:
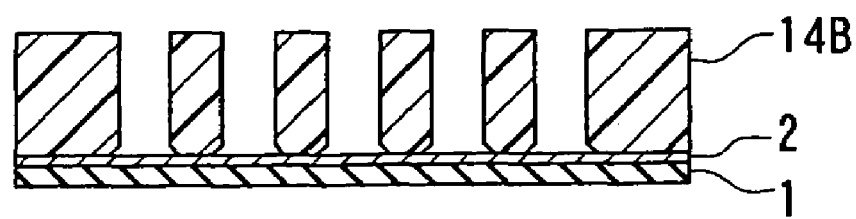
FIG. 14 is a cross section for illustrating a step that follows FIG. 13.

Next, the resist layer 14A is developed with a developer. A frame 14B is thereby made up of the remaining resist layer 14A, as shown in FIG. 14. The frame 14B is then cleaned with water and dried.

A microgroove is formed near the bottom of the frame 14B. In such a manner the frame 14B having an undercut near the bottom thereof is formed.

Figure 15:
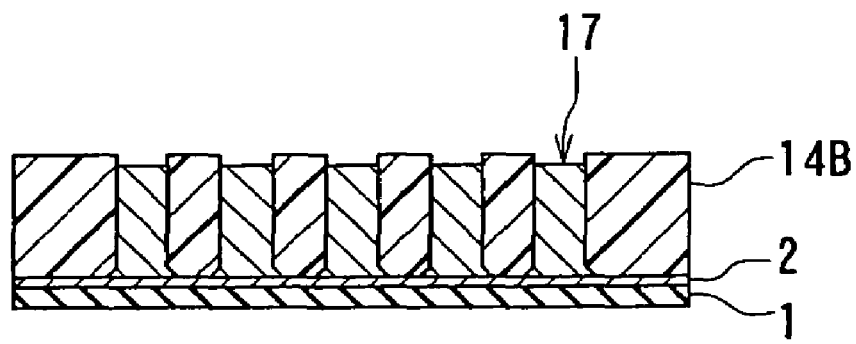
FIG. 15 is a cross section for illustrating a step that follows FIG. 14.

Next, pre-plating processing is performed as required, which is followed by feeding a current to the electrode film 2 to perform electroplating through the use of the frame 14B. A patterned thin film 17 is thereby formed in the groove of the frame 14B, as shown in FIG. 15. The patterned thin film 17 is made of a conductive material such as a metal, and may be made of copper (Cu).

Figure 16:
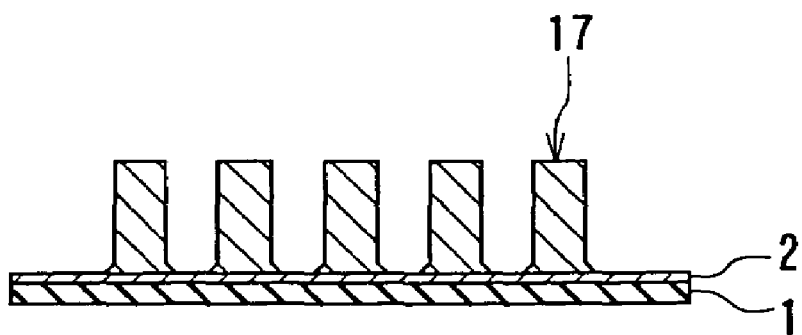
FIG. 16 is a cross section for illustrating a step that follows FIG. 15.

Next, the layered structure of FIG. 15 is soaked in an organic solvent and shaken, for example, so as to dissolve and remove the frame 14B, as shown in FIG. 16.

Figure 17:
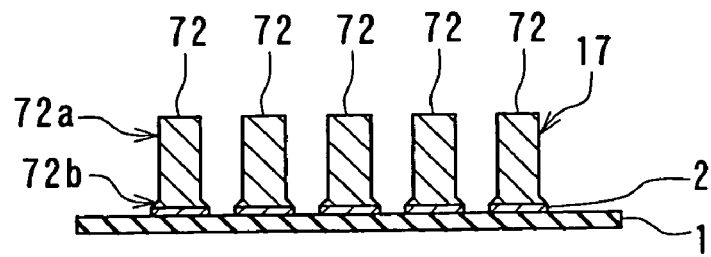
FIG. 17 is a cross section for illustrating a step that follows FIG. 16.

Finally, as shown in FIG. 17, portions of the electrode film 2 except the portion below the patterned thin film 17 are removed by wet etching, or dry etching such as ion milling or reactive ion etching, using the patterned thin film 17 as a mask.

The patterned thin film 17 thus formed includes a plurality of linear portions 72 disposed side by side. In the patterned thin film 17 each of the linear portions 72 has a second portion 72b close to the electrode film 2 that is the base layer of the patterned thin film 17. The second portion 72b has the maximum width that is greater than the width of the remaining portion, that is, a first portion 72a of each of the linear portions 72.

Figure 18:
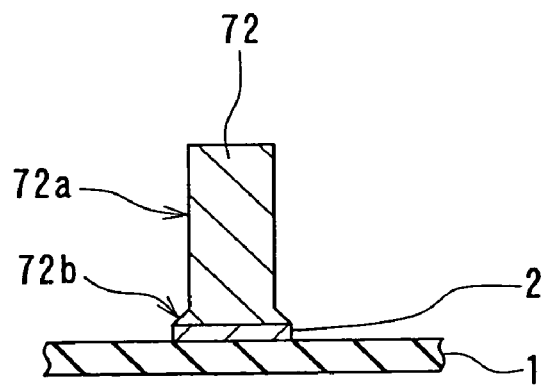
FIG. 18 is a cross section of an example of configuration of linear portions of the patterned thin film of the second embodiment.
Figure 19:
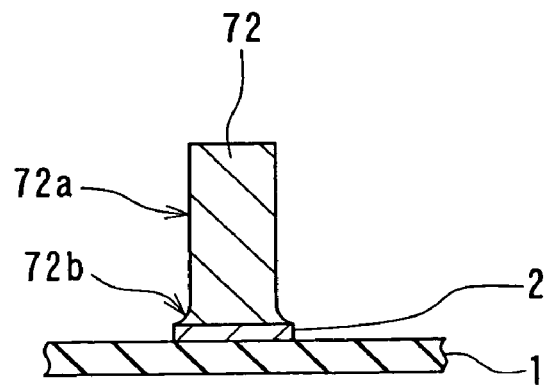
FIG. 19 is a cross section of another example of configuration of the linear portions of the patterned thin film of the second embodiment.
Figure 20:
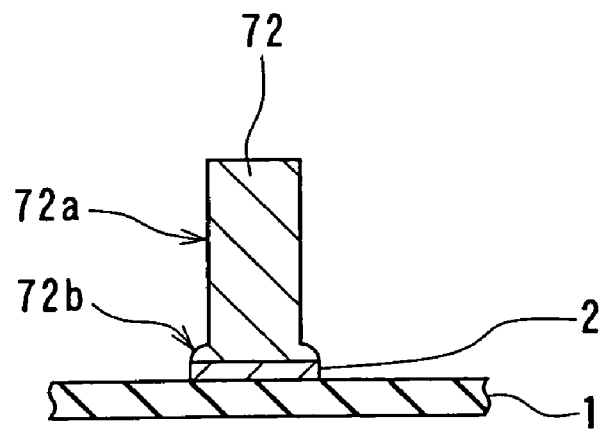
FIG. 20 is a cross section of still another example of configuration of the linear portions of the patterned thin film of the second embodiment.

FIG. 18 to FIG. 20 show examples of the shapes of the linear portions 72. In any of these examples the width of each of the second portions 72b is the greatest at the bottom of each of the linear portions 72, and decreases as the distance to each of the first portions 72a decreases. In the example shown in FIG. 18 each sidewall of the second portion 72b is an inclined plane that is at an angle with respect to the direction orthogonal to the top surface of the substrate 1. In the example shown in FIG. 19 each sidewall of the second portion 72b is a recessed surface that is at an angle with respect to the direction orthogonal to the top surface of the substrate 1. In the example shown in FIG. 20 each sidewall of the second portion 72b is a protruding surface that is at an angle with respect to the direction orthogonal to the top surface of the substrate 1.

An example of the method of forming the patterned thin film of the second embodiment will now be described. In this example the steps up to the step of forming the electrode film 2 are the same as that of the first embodiment.

In the following step of the example of the second embodiment a resist was applied to the electrode film 2 by spin-coating to form the resist layer 14A. The resist utilized was the SIPR-9691 (the product name) manufactured by Shin-Etsu Chemical Co., Ltd. The thickness of the resist layer 14A was 3 µm. Next, heat processing was performed on the resist layer 14A, using a hot plate, at a temperature of 100° C. for 180 seconds.

Next, the resist layer 14A was exposed through the mask 5, using an exposure apparatus, under the following conditions to form a latent image corresponding to the pattern of the mask 5 on the resist layer 14A. The exposure apparatus utilized was the NSR-i12TFH (the product name) manufactured by Nikon Corporation. The mask 5 had a pattern the same as that of the example of the first embodiment. The dose was 400 mJ/cm$^2$.

Next, an aqueous solution of 2.38% tetramethylammonium hydroxide was utilized as a developer to perform 50-second development on the resist layer 14A twice by the puddle method. The resist layer 14A was then cleaned with water and dried. The frame 14B was thus completed.

Next, electroplating was performed, using the frame 14B, to form the patterned thin film 17 of Cu in the groove of the frame 14B. A cupric sulfate bath that is typically used for plating of Cu was employed as a plating bath. The patterned thin film 17 had a thickness of 2.8 µm.

Next, the layered structure including the patterned thin film 17 was soaked in acetone and shaken to dissolve and remove the frame 14B.

Next, the electrode film 2 was selectively etched under the conditions the same as those of the example of the first embodiment, using an ion-milling apparatus, to remove portions of the electrode film 2 except the portion below the patterned thin film 17.

As thus described, a 10-turn thin-film coil that was made up of the patterned thin film 17 and that had a pitch of 2.5 µm and a thickness of 2.8 µm was obtained. In each of the linear portions 72 of the patterned thin film 17 the width of the first portion 72a was 1.7 µm and the maximum width of the second portion 72b was 1.9 µm. The second portion 72b had two portions extending more outward than the sidewalls of the first portion 72a. The cross section of each of these two portions was a wedge-like shape having the maximum width of 0.1 µm and the maximum height of 0.1 µm.

The remainder of configuration, functions and effects of the second embodiment are similar to those of the first embodiment.

Third Embodiment

Reference is now made to FIG. 21 to FIG. 28 to describe a method of forming a patterned thin film of a third embodiment of the invention. In the third embodiment a frame having an undercut near the bottom thereof is formed through the use of a resist having an image inverting capability. A method of forming a resist layer having an undercut near the bottom thereof through the use of a resist having an image inverting capability is disclosed in the U.S. Pat. No. 5,721,078, the U.S. Pat. No. 5,725,997 and the U.S. Pat. No. 5,747,198.

Figure 21:
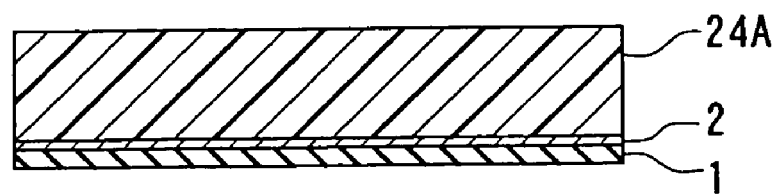
FIG. 21 is a cross section for illustrating a step in a method of forming a patterned thin film of a third embodiment of the invention.

The method of the third embodiment includes the steps up to the step of forming the electrode film 2 illustrated in FIG. 2 that are the same as those of the first embodiment. In the following step of the third embodiment a resist having an image inverting capability is applied to the electrode film 2 by spin-coating, for example, to form a resist layer 24A, as shown in FIG. 21. The resist having the image inverting capability is such a positive resist that a portion thereof becoming soluble in a developer by exposure then turns insoluble in the developer when heated. To be specific, the types of resists disclosed in the U.S. Pat. No. 5,721,078, the U.S. Pat. No. 5,725,997 and the U.S. Pat. No. 5,747,198 may be utilized as such a resist. Next, heat processing is performed on the resist layer 24A as required.

Figure 22:
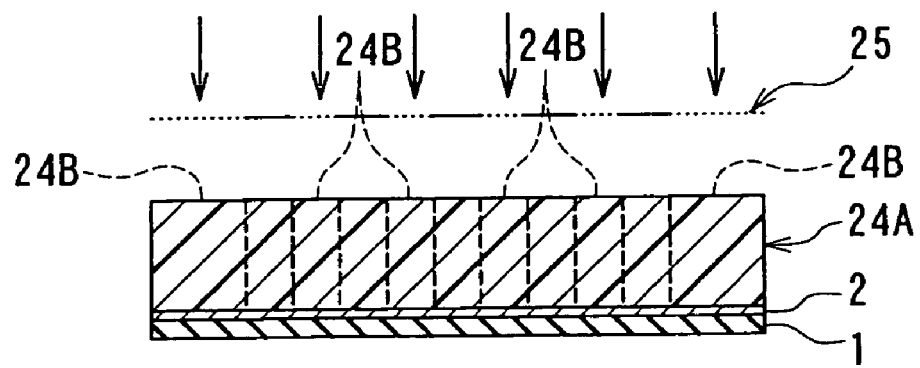
FIG. 22 is a cross section for illustrating a step that follows FIG. 21.

Next, as shown in FIG. 22, the resist layer 24A is exposed through a mask 25 to form a latent image corresponding to the pattern of the mask 25 on the resist layer 24A. Next, heat processing is performed on the resist layer 24A as required. The mask 25 has such a pattern that the portions of the resist layer 24A to be left after development are exposed. In FIG. 22 numerals 24B indicate the portions of the resist layer 24A exposed.

Figure 23:
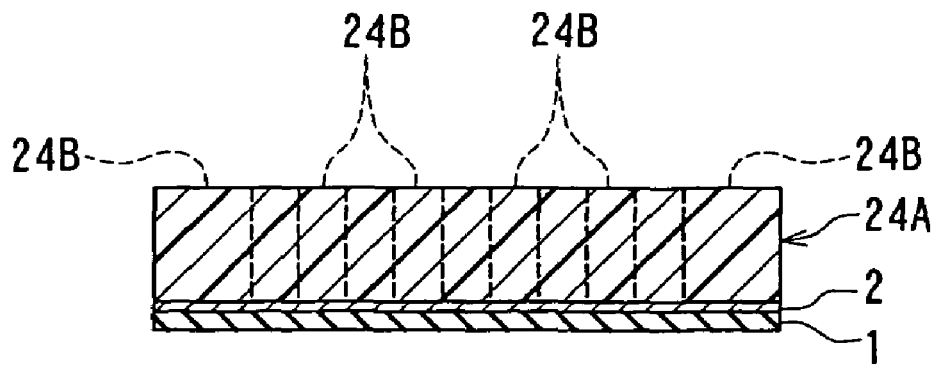
FIG. 23 is a cross section for illustrating a step that follows FIG. 22.

Next, as shown in FIG. 23, the resist layer 24A is heated so that the portions 24B of the resist layer 24A turn insoluble in a developer.

Figure 24:
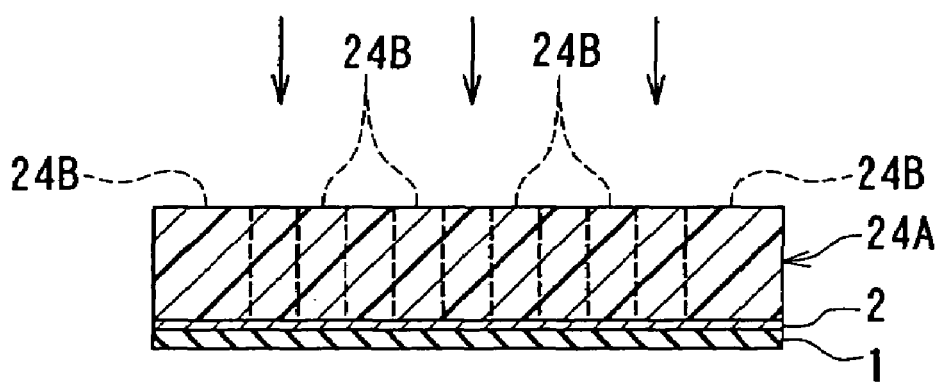
FIG. 24 is a cross section for illustrating a step that follows FIG. 23.

Next, as shown in FIG. 24, the entire surface of the resist layer 24A is exposed so that portions of the resist layer 24A except the portions 24B exposed by the first exposure turn soluble in the developer.

Figure 25:
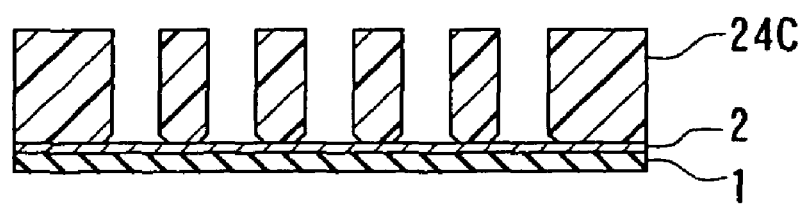
FIG. 25 is a cross section for illustrating a step that follows FIG. 24.

Next, the resist layer 24A is developed with the developer. The frame 24C is thereby made up of the remaining resist layer 24A, as shown in FIG. 25. The frame 24C is then cleaned with water and dried.

The frame 24C having an undercut near the bottom thereof is formed by using the resist having the image inverting capability, and by adjusting the conditions for exposure, post-exposure heat processing and development.

Figure 26:
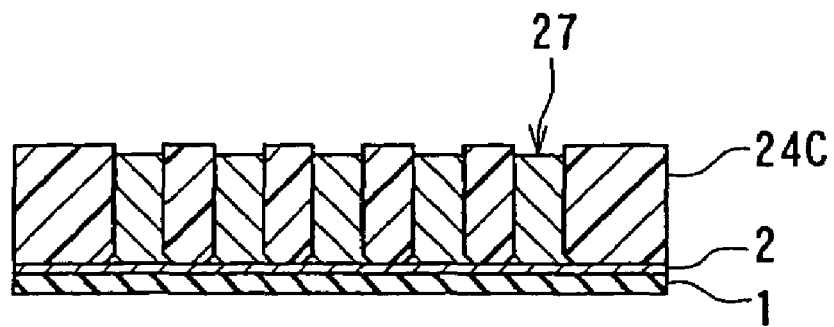
FIG. 26 is a cross section for illustrating a step that follows FIG. 25.

Next, pre-plating processing is performed as required, which is followed by feeding a current to the electrode film 2 to perform electroplating through the use of the frame 24C. A patterned thin film 27 is thereby formed in the groove of the frame 24C, as shown in FIG. 26. The patterned thin film 27 is made of a conductive material such as a metal, and may be made of copper (Cu).

Figure 27:
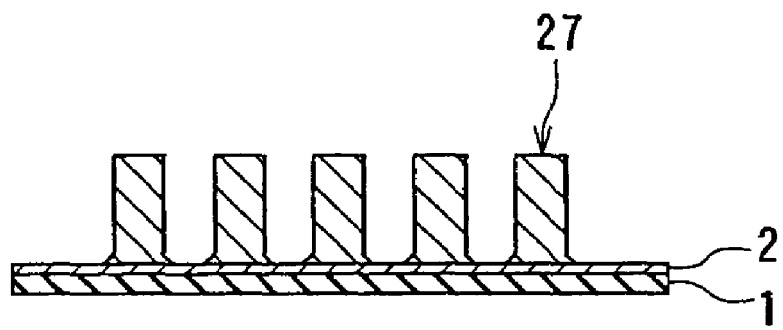
FIG. 27 is a cross section for illustrating a step that follows FIG. 26.

Next, the layered structure of FIG. 26 is soaked in an organic solvent and shaken, for example, so as to dissolve and remove the frame 24C, as shown in FIG. 27.

Figure 28:
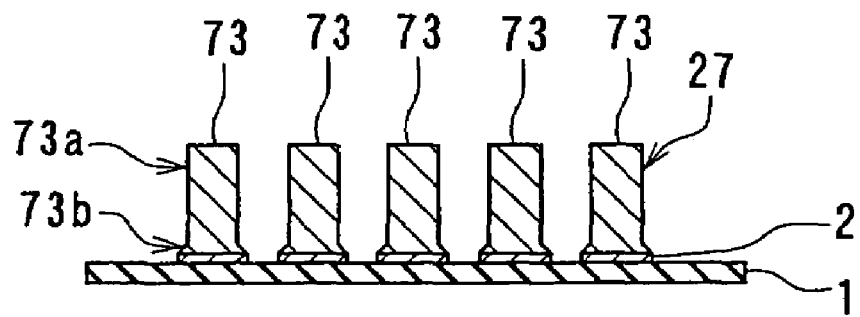
FIG. 28 is a cross section for illustrating a step that follows FIG. 27.

Finally, as shown in FIG. 28, portions of the electrode film 2 except the portion below the patterned thin film 27 are removed by wet etching, or dry etching such as ion milling or reactive ion etching, using the patterned thin film 27 as a mask.

The patterned thin film 27 thus formed includes a plurality of linear portions 73 disposed side by side. In the patterned thin film 27 each of the linear portions 73 has a second portion 73$b$ close to the electrode film 2 that is the base layer of the patterned thin film 27. The second portion 73$b$ has the maximum width that is greater than the width of the remaining portion, that is, a first portion 73$a$ of each of the linear portions 73.

The shapes of the linear portions 73 are the same as those of the linear portions 72 of the second embodiment.

An example of the method of forming the patterned thin film of the third embodiment will now be described. In this example the steps up to the step of forming the electrode film 2 are the same as that of the first embodiment.

In the following step of the example of the third embodiment a resist was applied to the electrode film 2 by spin-coating to form the resist layer 24A. The resist utilized was the AZ5214E (the product name) manufactured by Clariant Corporation. The thickness of the resist layer 24A was 3 µm. Next, heat processing was performed on the resist layer 24A, using a hot plate, at a temperature of 100° C. for 180 seconds.

Next, the resist layer 24A was exposed through the mask 25, using an exposure apparatus, under the following conditions to form a latent image corresponding to the pattern of the mask 25 on the resist layer 24A. The exposure apparatus utilized was the NSR-i12TFH (the product name) manufactured by Nikon Corporation. The mask 25 had a pattern in which a shade section was 10-turn whorl-shaped and had a width of 1.5 µm, and a translucent section had a width of 1.0 µm, and the pitch of the shade section was 2.5 µm. The dose was 50 mJ/cm$^2$.

Next, heat processing was performed on the resist layer 24A, using the hot plate, at a temperature of 100° C. for 180 seconds, so that the portion 24B of the resist layer 24A exposed turns insoluble in a developer.

Next, the entire surface of the resist layer 24A was exposed, using an exposure apparatus, so that portions of the resist layer 24A except the portions 24B exposed by the first exposure turn soluble in the developer. The exposure apparatus utilized was the NSR-i12TFH (the product name) manufactured by Nikon Corporation. The dose was 100 mJ/cm$^2$.

Next, an aqueous solution of 2.38% tetramethylammonium hydroxide was utilized as a developer to perform 50-second development on the resist layer 24A four times by the puddle method. The resist layer 24A was then cleaned with water and dried. The frame 24C was thus completed.

Next, electroplating was performed, using the frame 24C, to form the patterned thin film 27 of Cu in the groove of the frame 24C. A cupric sulfate bath that is typically used for plating of Cu was employed as a plating bath. The patterned thin film 27 had a thickness of 2.8 µm.

Next, the layered structure including the patterned thin film 27 was soaked in acetone and shaken to dissolve and remove the frame 24C.

Next, the electrode film 2 was selectively etched under the conditions the same as those of the example of the first embodiment, using an ion-milling apparatus, to remove portions of the electrode film 2 except the portion below the patterned thin film 27.

As thus described, a 10-turn thin-film coil that was made up of the patterned thin film 27 and that had a pitch of 2.5 µm and a thickness of 2.8 µm was obtained. In each of the linear portions 73 of the patterned thin film 27 the width of the first portion 73$a$ was 1.7 µm and the maximum width of the second portion 73$b$ was 2.0 µm. The second portion 73$b$ had two portions extending more outward than the sidewalls of the first portion 73$a$. The cross section of each of these two portions had a wedge-like shape having the maximum width of 0.15 μm and the maximum height of 0.2 μm.

The remainder of configuration, functions and effects of the third embodiment are similar to those of the first embodiment.

The present invention is not limited to the foregoing embodiments but may be practiced in still other ways. For example, the invention is applicable to not only the thin-film inductor illustrated in the first embodiment but to formation of patterned thin films of other microdevices such as a thin-film magnetic head, a semiconductor device, a sensor incorporating thin films, and an actuator incorporating thin films. The patterned thin film is not limited to a coil but may be wiring and so on.

According to the method of forming the patterned thin film of the invention as thus described, the patterned thin film is formed by plating through the use of the frame having the undercut near the bottom thereof. As a result, according to the invention, it is possible to form the patterned thin film including the linear portions that are small in width and have a low resistance, employing frame plating.

The patterned thin film of the invention is disposed on the base layer and includes the linear portions. Each of the linear portions has a portion close to the base layer. This portion has a width greater than the width of the remaining portion of each of the linear portions. The invention thereby achieves the patterned thin film including the linear portions that are small in width and have a low resistance.

Obviously many modifications and variations of the present invention are possible in the light of the above teachings. It is therefore to be understood that within the scope of the appended claims the invention may be practiced otherwise than as specifically described.

What is claimed is:

1. A method of forming a patterned film by frame plating, the patterned film being made of a conductive material and including a plurality of linear portions disposed side by side, the method comprising:

forming a frame having an undercut near a bottom thereof on a base layer;

forming the patterned film by plating through the use of the frame such that each of the linear portions has a first portion and a second portion; and removing the frame after the patterned film is formed, wherein the second portion is closer to the base layer than the first portion, wherein the second portion touches the base layer and has a width greater than a width of the first portion taken at an interface between the first portion and the second portion, and wherein adjacent ones of the first portions have a space therebetween, adjacent ones of the second portions have a space therebetween, and the space between the adjacent ones of the first portions is greater than the space between the adjacent ones of the second portions.

* * * * *